United States Patent
Park

(10) Patent No.: US 9,305,608 B2
(45) Date of Patent: Apr. 5, 2016

(54) MEMORY DEVICE WITH REDUCED OPERATING CURRENT

(71) Applicant: SAMSUNG ELECTRONICS CO., LTD., Suwon-Si, Gyeonggi-Do (KR)

(72) Inventor: Hyun-Kook Park, Anyang-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/637,647

(22) Filed: Mar. 4, 2015

(65) Prior Publication Data

US 2015/0318025 A1 Nov. 5, 2015

(30) Foreign Application Priority Data

May 2, 2014 (KR) ................. 10-2014-0053449

(51) Int. Cl.
*G11C 5/06* (2006.01)
*G11C 13/00* (2006.01)
*G11C 11/4094* (2006.01)
*G11C 11/4097* (2006.01)
*G11C 11/4099* (2006.01)

(52) U.S. Cl.
CPC .............. *G11C 5/06* (2013.01); *G11C 11/4094* (2013.01); *G11C 11/4097* (2013.01); *G11C 11/4099* (2013.01); *G11C 13/004* (2013.01); *G11C 13/0069* (2013.01)

(58) Field of Classification Search
CPC .... G11C 5/06; G11C 13/004; G11C 13/0069; G11C 11/4094; G11C 11/4097; G11C 11/4099; G11C 7/14

USPC .......... 365/63, 185.13, 230.03, 230.06, 210.1
See application file for complete search history.

(56) References Cited

U.S. PATENT DOCUMENTS

| | | | |
|---|---|---|---|
| 6,091,655 A * | 7/2000 | Yamada | G11C 7/062 257/E27.086 |
| 6,549,042 B2 | 4/2003 | Proebsting | |
| 6,950,369 B2 | 9/2005 | Kunikiyo et al. | |
| 7,272,053 B2 | 9/2007 | Choy | |
| 7,400,536 B1 | 7/2008 | Lin et al. | |
| 7,626,883 B2 * | 12/2009 | Shimano | G11C 5/063 365/185.13 |
| 7,679,948 B2 | 3/2010 | Park et al. | |
| 8,320,196 B2 | 11/2012 | Yan et al. | |
| 8,406,062 B2 | 3/2013 | Seol et al. | |
| 8,917,567 B2 * | 12/2014 | Takayama | G11C 7/12 365/185.25 |
| 2011/0235393 A1 | 9/2011 | Yoshihara et al. | |
| 2012/0020142 A1 | 1/2012 | Yu et al. | |
| 2013/0176790 A1 | 7/2013 | Nguyen et al. | |

FOREIGN PATENT DOCUMENTS

JP 2008097705 4/2008

\* cited by examiner

*Primary Examiner* — Gene Auduong
(74) *Attorney, Agent, or Firm* — Volentine & Whitt, PLLC

(57) ABSTRACT

A memory device may including a first local bit line electrically connected with a first memory cell, a first global bit line electrically connected with the first local bit line, a second local bit line electrically connected with a second memory cell, and a second global bit line electrically connected with the second local bit line. The first global bit line is primarily charged with electric charge. The first global bit line and the second global bit line share the primarily charged electric charge. The second global bit line is secondarily charged with the electric charge.

20 Claims, 20 Drawing Sheets

FIG. 1

| | 1_1 | 1_2 | 1_3 | 1_4 | 1_5 | 1_6 | 1_7 | 1_8 |
|---|---|---|---|---|---|---|---|---|
| | BLK7 | BLK7 | BLK7 | BLK7 | BLK7 | BLK7 | BLK7 | BLK7 |
| | BLK6 | BLK6 | BLK6 | BLK6 | BLK6 | BLK6 | BLK6 | BLK6 |
| | BLK5 | BLK5 | BLK5 | BLK5 | BLK5 | BLK5 | BLK5 | BLK5 |
| | BLK4 | BLK4 | BLK4 | BLK4 | BLK4 | BLK4 | BLK4 | BLK4 |
| | BLK3 | BLK3 | BLK3 | BLK3 | BLK3 | BLK3 | BLK3 | BLK3 |
| | BLK2 | BLK2 | BLK2 | BLK2 | BLK2 | BLK2 | BLK2 | BLK2 |
| | BLK1 | BLK1 | BLK1 | BLK1 | BLK1 | BLK1 | BLK1 | BLK1 |
| | BLK0 | BLK0 | BLK0 | BLK0 | BLK0 | BLK0 | BLK0 | BLK0 |

| SA/WD(2_1) | SA/WD(2_2) | SA/WD(2_3) | SA/WD(2_4) |
|---|---|---|---|

| PERIPHERY(3) |
|---|

| SA/WD(2_8) | SA/WD(2_7) | SA/WD(2_6) | SA/WD(2_5) |
|---|---|---|---|

| BLK7 | BLK7 | BLK7 | BLK7 | BLK7 | BLK7 | BLK7 | BLK7 |
|---|---|---|---|---|---|---|---|
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| 1_16 | 1_15 | 1_14 | 1_13 | 1_12 | 1_11 | 1_10 | 1_9 |

MEMORY DEVICE WITH REDUCED OPERATING CURRENT

CROSS-REFERENCE TO RELATED APPLICATION

A claim of priority under 35 U.S.C. §119 is made to Korean Patent Application No. 10-2014-0053449 filed on May 2, 2014, the entire contents of which are hereby incorporated by reference.

BACKGROUND

The present inventive concept relates to a memory device with reduced operating current.

As the size of memory devices has increased so as to provide increased storage capacity, bit lines and word lines connected with memory cells may be disposed as having a hierarchical structure. For example, a bit line may include a global bit line and a plurality of local bit lines connected with the global bit line. A word line may include a main word line and a plurality of sub-word lines connected with the main word line.

In such cases, distances between a read circuit and a write circuit, and a memory cell may be significantly increased. As a result, capacitance of bit lines may also be relatively large. Further, the amount of current required for charging and discharging a bit line may also be relatively large. For example, a memory device in which hundreds of read circuits simultaneously operate may require current of hundreds of mA in order to charge a plurality of bit lines for each read operation. The current consumption may deteriorate current performance of memory and generate power noise.

SUMMARY

The present inventive concept may provide a memory device with reduced operating current.

The present inventive concept is not limited to the aforementioned memory device, and other memory devices, which are not mentioned above, will be apparent to those skilled in the art from the following description.

In an embodiment of the inventive concept, there is provided a memory device including a first local bit line electrically connected with a first memory cell, a first global bit line electrically connected with the first local bit line, a second local bit line electrically connected with a second memory cell, and a second global bit line electrically connected with the second local bit line. The first global bit line may be primarily charged with electric charge. The first global bit line and the second global bit line may share the primarily charged electric charge. The second global bit line may be secondarily charged with the electric charge.

A charge amount charged in the first global bit line through the primary charging and a charge amount charged in the second global bit line through the secondary charging may be the same as each other, and the amount of secondary current used for the secondary charging may be smaller than the amount of primary current used for the primary charging.

The primary charging may be a read operation of the first memory cell and the secondary charging may be a read operation of the second memory cell.

The primary charging may be a write operation of the first memory cell and the secondary charging may be a write operation of the second memory cell.

Each of the first memory cell and the second memory cell may be a memory cell including a resistor.

The write operation of the first memory cell may represent writing reset data in the first memory cell.

The primary charging and the secondary charging may be performed by a read circuit or by a write circuit.

The secondary charging may be performed by the read circuit or by the write circuit, and the primary charging may be performed by a precharge circuit other than the read circuit and the write circuit.

The first local bit line may be a dummy local bit line and the first global bit line may be a dummy global bit line.

The memory device may further include a third local bit line electrically connected with a third memory cell and a third global bit line electrically connected with the third local bit line. The third global bit line and the first global bit line may share electric charge, before tertiarily charging the third global bit line.

The first global bit line may be charged with electric charge as large as a first charge amount associated with the read operation in a standby interval. When the write operation is started, the first global bit line may be charged with electric charge as large as a third charge amount associated with the write operation and larger than the first charge amount.

The first global bit line may include a first write global bit line and a first read global bit line. The second global bit line may include a second write global bit line and a second read global bit line. The electric charge sharing may include electric charge sharing by the first write global bit line and the second write global bit line, or electric charge sharing by the first read global bit line and the second read global bit line.

In the primary charging, a charge amount charged in the first write global bit line and a charge amount charged in the first read global bit line may be different from each other.

In another embodiment of the inventive concept, there is provided a memory device including a normal local bit line electrically connected with a normal memory cell, a normal global bit line electrically connected with the normal local bit line, a dummy local bit line electrically connected with a dummy memory cell, and a dummy global bit line electrically connected with the dummy local bit line and precharged with target voltage. The precharged dummy global bit line and the normal global bit line may be electrically connected with each other, before reading or writing the normal memory cell.

The memory device may further include a write circuit for writing data by providing write current to the normal memory cell and a read circuit for reading data by providing read current to the normal memory cell. Precharging the dummy global bit line may be performed by a precharge circuit other than the read circuit and the write circuit.

In still another embodiment of the inventive concept, there is provided a memory device including a first local bit line electrically connected with a first memory cell, a first global bit line electrically connected with the first local bit line, a second local bit line electrically connected with a second memory cell, and a second global bit line electrically connected with the second local bit line. When first data is written in the second memory cell, the first global bit line and the second global bit line may share electric charge before providing first write current to the second memory cell. When second data other than the first data is written in the second memory cell, the first global bit line and the second global bit line may not share electric charge before providing second write current to the second memory cell.

The first data may be reset data and the second data may be set data.

The second write current may include a quenching interval.

When data is read from the second memory cell, the first global bit line and the second global bit line may share electric charge before providing read current to the second memory cell.

Each of the first memory cell and the second memory cell may be a non-volatile memory cell including a resistor.

BRIEF DESCRIPTION OF THE DRAWINGS

The above and other features and advantages of the inventive concept will become more apparent by describing in detail embodiments thereof with reference to the attached drawings in which:

FIG. 1 is a block diagram illustrating a non-volatile memory device according to embodiments of the inventive concept.

DETAILED DESCRIPTION

Figure 2:
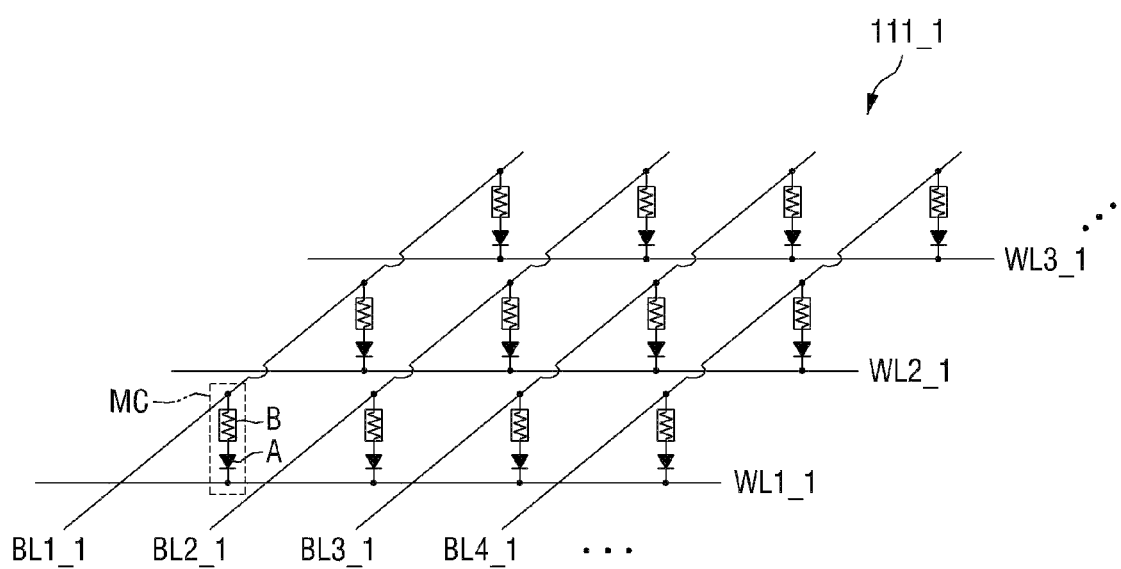
FIGS. 2 and 3 are diagrams illustrating a memory cell array of FIG. 1.

Advantages and features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, and so on may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosure.

Unless otherwise defined, all terms (including technical and scientific terms) used herein have the same meaning as commonly understood by one of ordinary skill in the art to which the inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, embodiments of the inventive concept will be described by using a phase change random access memory (PRAM). However, it is apparent to those skilled in the art that the inventive concept can be applied to all non-volatile memory devices using a resistor, such as a resistive RAM (RRAM) and a magnetic RAM (MRAM). Further, it is apparent to those skilled in the art that the inventive concept can be applied to even another memory device having a hierarchical structure using a global bit line and a local bit line.

FIG. 1 is a block diagram illustrating a non-volatile memory device according to embodiments of the inventive concept. In FIG. 1, the non-volatile memory device is illustrated, which is constituted by 16 memory banks as an example for easy description, but is not limited thereto.

Referring to FIG. 1, the non-volatile memory device according to embodiments of the inventive concept may include a memory cell array, read/write circuits 2_1 to 2_8, and a periphery circuit area 3.

The memory cell array may be constituted by a plurality of memory banks 1_1 to 1_16. Each of the memory banks 1_1 to 1_16 may be constituted by a plurality of memory blocks BLK0 to BLK7. Each of the memory blocks 1_1 to 1_16 may include a plurality of non-volatile memory cells arranged in a matrix pattern. In each of the embodiments of the inventive concept, eight memory blocks are disposed as an example, but the inventive concept is not limited thereto.

Further, although not illustrated in detail in FIG. 1, a row select circuit and a column select circuit, which designate a row and a column of resistive memory cells to be written/read, respectively, are disposed to correspond to the memory banks 1_1 to 1_16.

The read/write circuits 2_1 to 2_8 may be disposed to correspond to two memory banks 1_1 to 1_16 in order to perform read and write operations in the corresponding memory banks. In the embodiments, the read/write circuits 2_1 to 2_8 may correspond to two memory banks 1_1 to 1_16 as an example, but are not limited thereto. That is, the read/write circuits 2_1 to 2_8 may be disposed to correspond to one memory bank or four memory banks. The read/write circuits 2_1 to 2_8 may include only the read circuits, only the write circuits, or both the read circuits and the write circuits. Herein, the read circuits may include a sense amplifier, and the write circuits may include a write driver.

A plurality of logic circuit blocks and a voltage generating unit for operating the column select circuit, the row select circuit, and the read/write circuits 2_1 to 2_8, and the like may be disposed in the periphery circuit area 3.

Figure 3:
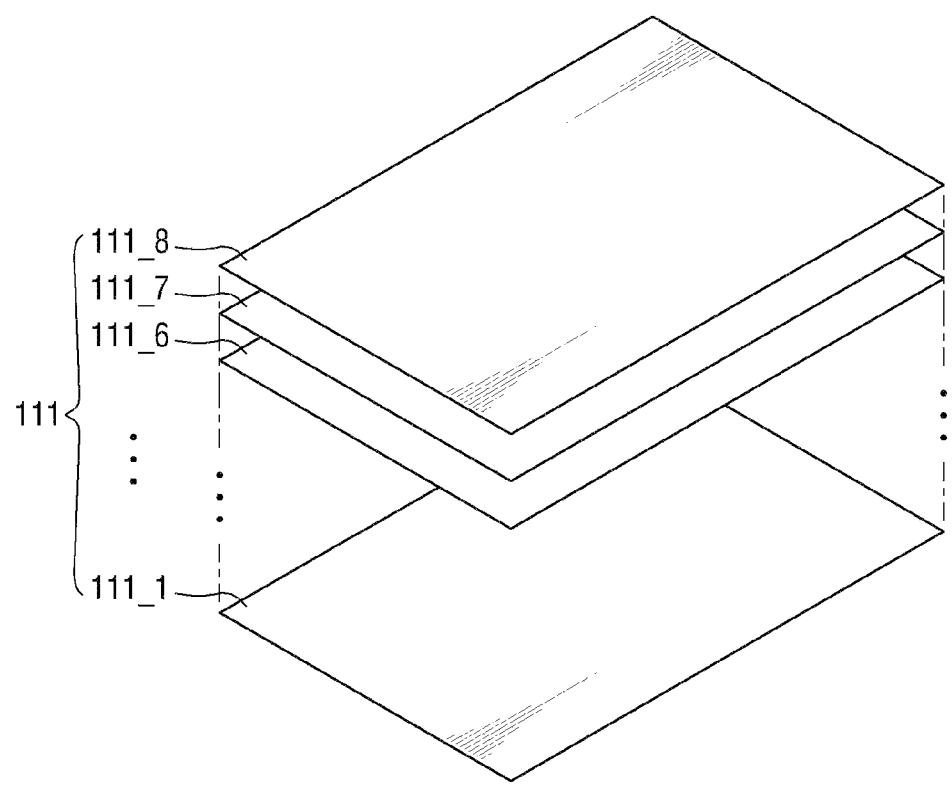

FIGS. 2 and 3 are diagrams describing a memory cell array of FIG. 1.

First, referring to FIG. 2, the memory cell array may have a cross point structure. The cross point structure means a structure where one memory cell is formed in an area in which one line and another line cross each other. For example, the bit lines BL1_1 to BL4_1 may extend in a first direction, and the word lines WL1_1 to WL3_1 may extend in a second direction to cross the bit lines BL1_1 to BL4_1. A resistive memory cell MC may be formed in an area in which the respective bit lines BL1_1 to BL4_1 and the respective word lines WL1_1 to WL3_1 cross each other.

The resistive memory cell MC represents a resistive memory cell MC selected to be read among a plurality of resistive memory cells MCs in the memory cell array. Herein, when the resistive memory cell MC is a PRAM, the resistive memory cell MC may include a variable resistance element B including a phase change material and an access element A. The access element A may control current that flows on the variable resistance element B. Herein, the access element A may be a diode or a transistor that is connected with the variable resistance element B in series. Further, as the phase change material, various types of materials may be used, such as GaSb, InSb, InSe, $Sb_2Te_3$, and GeTe in which two elements are combined, GeSbTe, GaSeTe, InSbTe, $SnSb_2Te_4$, and InSbGe in which three elements are combined, AgInSbTe, (GeSn)SbTe, GeSb(SeTe), and $Te_{81}Ge_{15}Sb_2S_2$ in which four elements are combined, and the like. Among them, GeSbTe composed of germanium (Ge), antimony (Sb), and tellurium (Te) may be primarily used.

Meanwhile, when the resistive memory cell MC is an RRAM, the variable resistance element B may include, for example, NiO or perovskite. The perovskite may be a composition of manganite ($Pr_{0.7}Ca_{0.3}MnO_3$, $Pr_{0.5}Ca_{0.5}MnO_3$, other PCMO, LCMO, and the like), titanate (STO:Cr), zirconate (SZO:Cr, $Ca_2Nb_2O_7$:Cr, $Ta_2O_5$:Cr), and the like.

Alternatively, the memory cell array may have a 3D lamination structure as illustrated in FIG. 3. The 3D lamination structure means a form in which a plurality of memory cell arrays 111_1 to 111_8 are vertically laminated. In FIG. 3, eight memory cell arrays 111_1 to 111_8 are laminated as an example, but the inventive concept is not limited thereto. Herein, each of the plurality of memory cell arrays 111_1 to 111_8 may include a plurality of memory cell groups and/or a plurality of redundancy memory cell groups. When the plurality of memory cell arrays 111_1 to 111_8 are arranged in the 3D lamination structure, each of the plurality of memory cell arrays 111_1 to 111_8 may have the cross point structure illustrated in FIG. 2, but the structure of each memory cell layer is not limited thereto.

Figure 4:
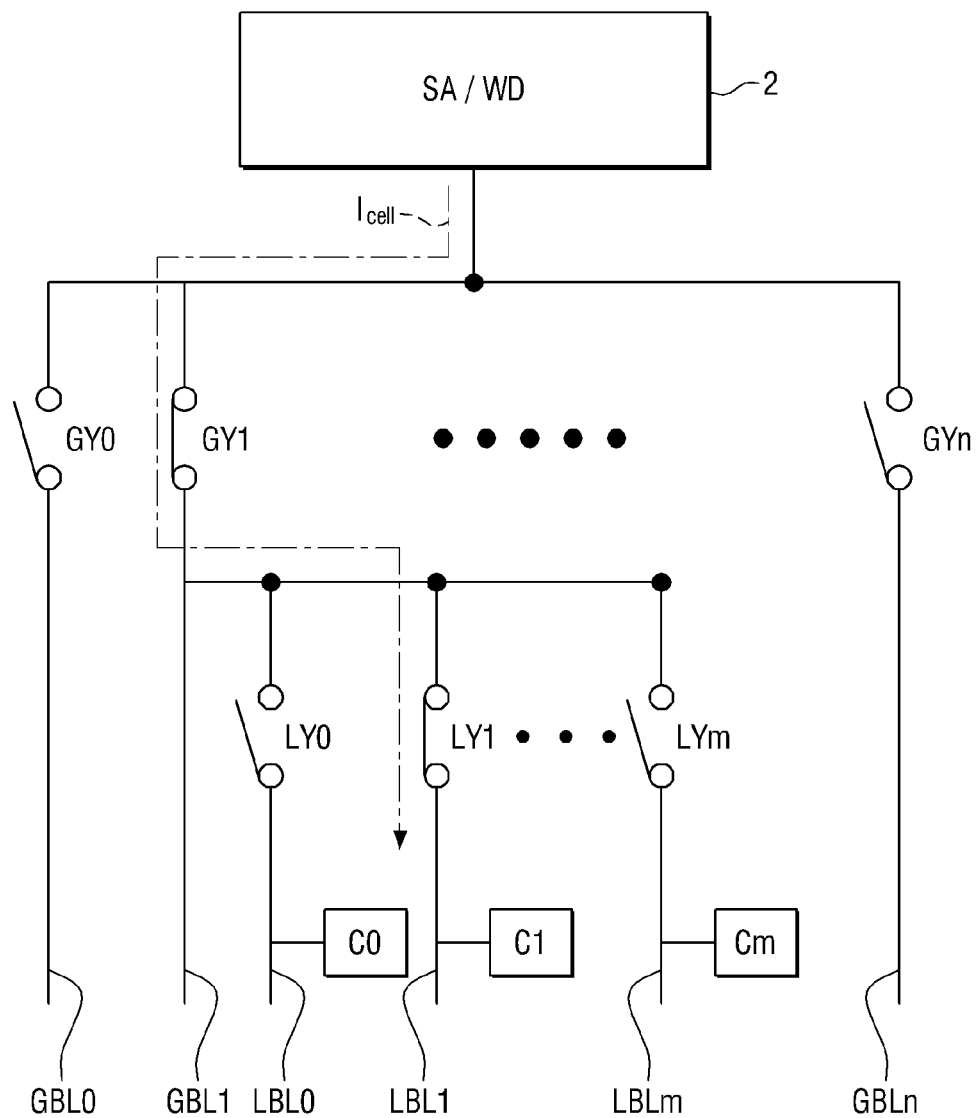
FIG. 4 is a circuit diagram illustrating a non-volatile memory device according to embodiments of the inventive concept.

FIG. 4 is a circuit diagram describing the non-volatile memory device according to the embodiments of the inventive concept.

Referring to FIG. 4, in the non-volatile memory device according to embodiments of the inventive concept, the bit line may include global bit lines GBL0 to GBLn (however, n is a natural number) and a plurality of local bit lines LBL0 to LBLm (however, m is a natural number) connected with the global bit lines GBL0 to GBLn. For easy description, the plurality of local bit lines LBL0 to LBLm and a plurality of memory cells C0 to Cm may be electrically connected to only the global bit line GBL1, but the plurality of local bit lines LBL0 to LBLm and the plurality of memory cells C0 to Cm may be electrically connected to even other global bit lines GBL0 and GBL2 to GBLn.

A plurality of global pass circuits GY0 to GYn may be disposed among the read/write circuit 2 and the plurality of global bit lines GBL0 to GBLn. Further, a plurality of local pass circuits LY0 to LYm may be disposed among the plurality of global bit lines GBL0 to GBLn and the plurality of local bit lines LBL0 to LBLm. Accordingly, some circuits (for example, GY1 and LY1) may be selected from the plurality of global pass circuits GY0 to GYn and the plurality of local pass circuits LY0 to LYm in order to select the memory cell (for example, C1) to be read or written. Cell current Icell (that is, read current or write current) provided in the read/write circuit 2 may be transferred to the memory cell C1 via the global pass circuit GY1, the global bit line GBL1, the local pass circuit LY1, and the local bit line LBL1.

Figure 5:
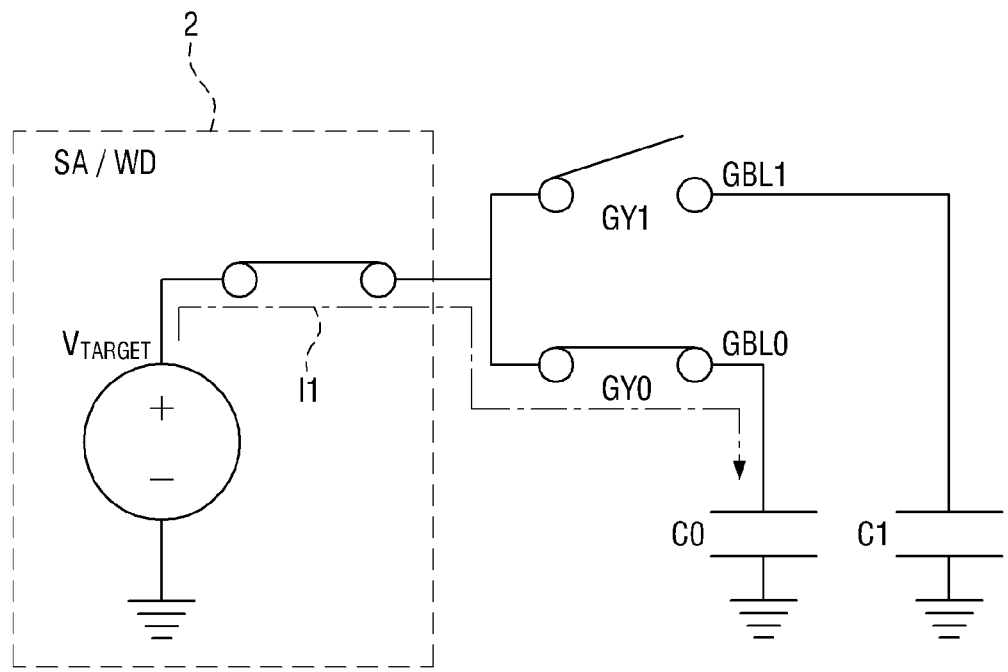
FIGS. 5, 6 and 7 are diagrams illustrating a non-volatile memory device according to a first embodiment of the inventive concept.
Figure 6:
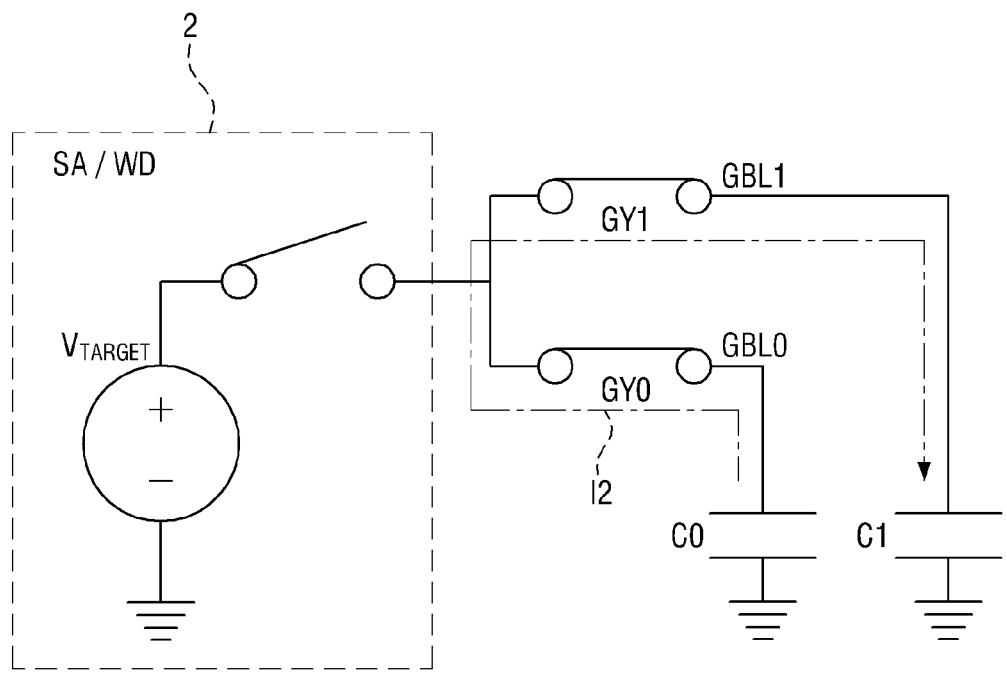
Figure 7:
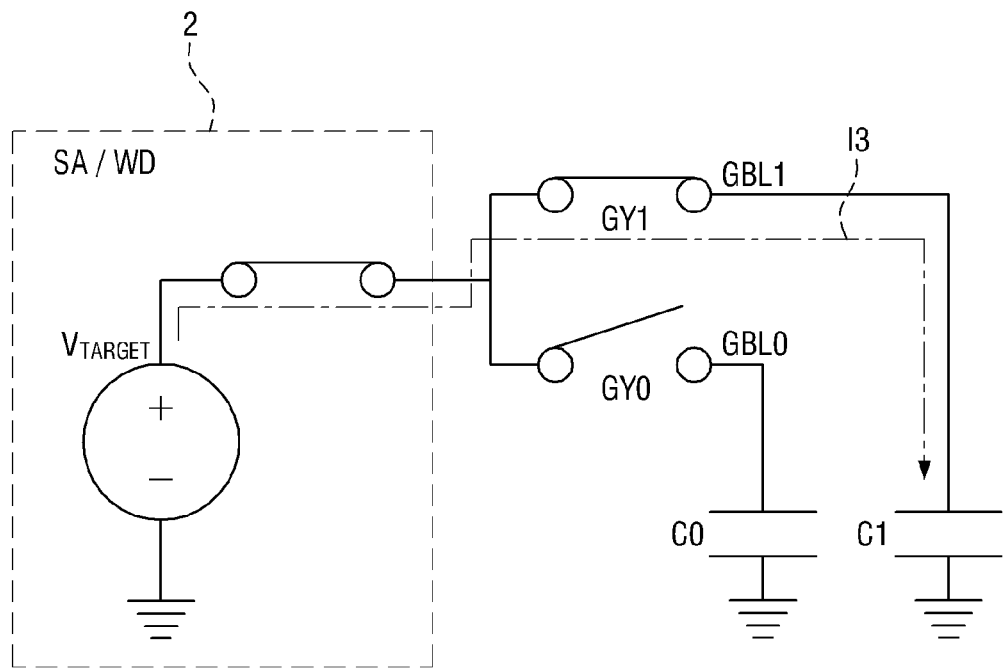

FIGS. 5 to 7 are diagrams describing a non-volatile memory device according to a first embodiment of the inventive concept. For easy description, in FIGS. 5 to 7, only the first and second global bit lines GBL0 and GBL1 are illustrated. First and second capacitors C0 and C1 may be inherently included in the first and second global bit lines GBL0 and GBL1, respectively. Capacitances of the first and second capacitors C0 and C1 may have the same value CF for example, but are not limited thereto.

First, referring to FIG. 5, the read/write circuit 2 may provide current I1 to primarily charge electric charge in the first global bit line GBL0. That is, the first global pass circuit GY0 may be selected, and as a result, the first capacitor C0 of the first global bit line GBL0 may be charged with target voltage $V_{TARGET}$. That is, a charge amount charged in the first capacitor C0, Q0 may be $1 \times CF \times V_{TARGET}$.

Herein, the target voltage $V_{TARGET}$ means voltage used in the read/write circuit 2. In detail, when the read/write circuit 2 tries to perform the read operation, the target voltage $V_{TARGET}$ means voltage suitable for the read operation. Further, when the read/write circuit 2 tries to perform the write operation, the target voltage $V_{TARGET}$ means voltage suitable for the write operation.

Referring to FIG. 6, the first global bit line GBL0 and the second global bit line GBL1 may share the charged electric charge. That is, while the read/write circuit 2 does not supply current, the first global pass circuit GY0 and the second global pass circuit GY1 may be simultaneously selected. Accordingly, current I2 may be formed from the first global bit line GBL0 to the second global bit line GBL1. As a result of sharing the electric charge, a charge amount charged in the first capacitor C0, Q0 may be $1/2 \times CF \times V_{TARGET}$ and a charge amount charged in the second capacitor C1, Q1 may be $1/2 \times CF \times V_{TARGET}$.

Referring to FIG. 7, the read/write circuit 2 may secondarily charge the electric charge in the second global bit line GBL1. That is, the second global pass circuit GY1 may be selected, and as a result, the second capacitor C1 of the second global bit line GBL1 may be charged with the target voltage $V_{TARGET}$. A charge amount charged in the second capacitor C1, Q1 may be $1 \times CF \times V_{TARGET}$. However, since $1/2 \times CF \times V_{TARGET}$ has already been charged in the second capacitor C1 through the electric charge sharing, only current enough to charge residual $1/2 \times CF \times V_{TARGET}$ may be supplied to the read/write circuit 2. Accordingly, the amount of current used by the read/write circuit 2 may be decreased.

In summary, the charge amount ($Q0=1 \times CF \times V_{TARGET}$) charged in the first global bit line GBL0 through the primary charging and the charge amount ($Q1=1 \times CF \times V_{TARGET}$) charged in the second global bit line GBL1 through the secondary charging may be the same as each other. However, the amount of secondary current used for the secondary charging may be smaller than the amount of primary current used for the primary charging.

The primary charging may be a read operation of a first memory cell connected to the first global bit line GBL0 and the secondary charging may be a read operation of a second memory cell connected to the second global bit line GBL1. Alternatively, the primary charging may be a write operation of the first memory cell connected to the first global bit line GBL0 and the secondary charging may be a write operation of the second memory cell connected to the second global bit line GBL1.

Figure 8:
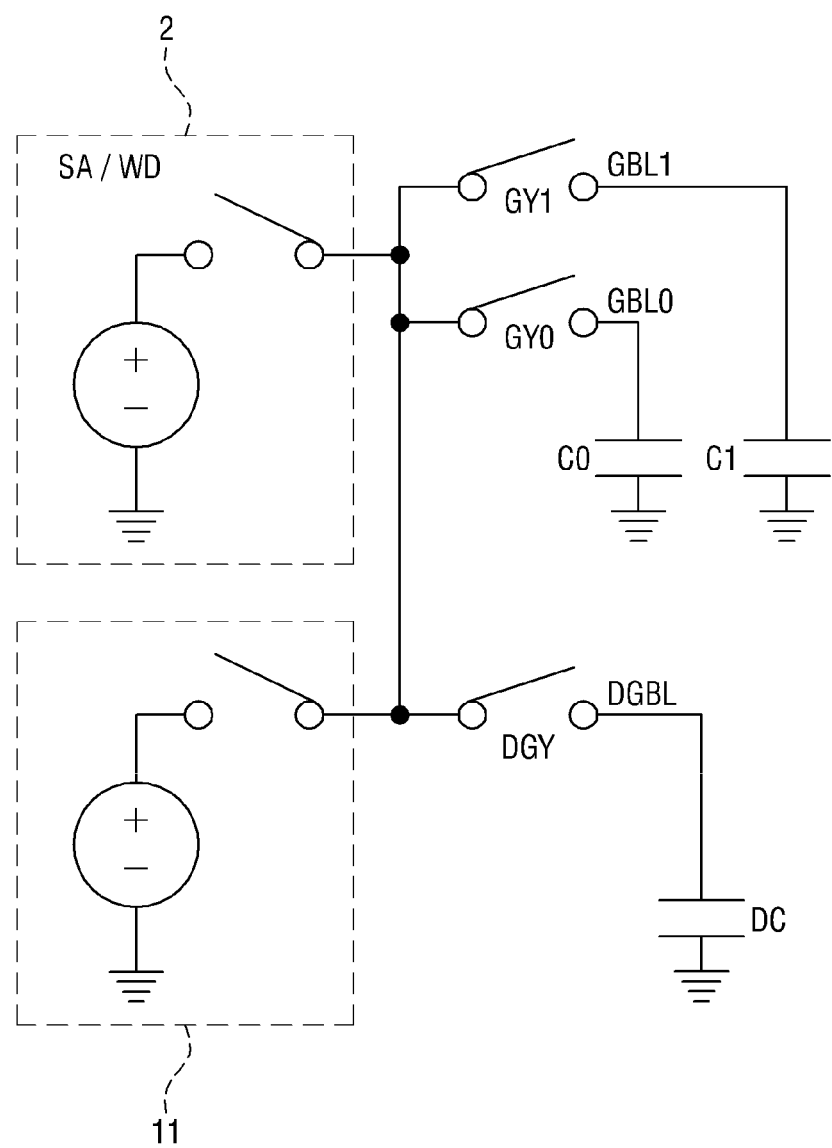
FIG. 8 is a diagram illustrating a non-volatile memory device according to a second embodiment of the inventive concept.

FIG. 8 is a diagram describing a non-volatile memory device according to a second embodiment of the inventive concept. For convenience of the description, differences from the description with reference to FIGS. 5 to 7 will be primarily described.

Referring to FIG. 8, the non-volatile memory device according to the second embodiment of the inventive concept may further include a dummy global bit line DGBL, a dummy local bit line electrically connected with the dummy global bit line DGBL, and a precharge circuit 11. A dummy capacitor DC may be inherently included in the dummy global bit line DGBL. Capacitance of the dummy capacitor DC and capacitances of the first and second global bit lines GBL0 and GBL1 may have the same value CF as an example, but the present disclosure is not limited thereto.

The precharge circuit 11 as a separate circuit other from the read/write circuit 2 may be a circuit used for charging the dummy capacitor DC of the dummy global bit line DGBL.

An exemplary operation of the non-volatile memory device according to the second embodiment of the inventive concept will be described below. First, the precharge circuit 11 may charge the dummy capacitor DC of the dummy global bit line DGBL. Herein, a charge amount charged in the dummy capacitor DC, Q2 may be $1 \times CF \times V_{TARGET}$.

Subsequently, the dummy capacitor DC and the first capacitor C0 may share electric charge. As a result of sharing the electric charge, a charge amount charged in the first capacitor C0, Q0 may be $1/2 \times CF \times V_{TARGET}$ and a charge amount charged in the dummy capacitor DC, Q2 may be $1/2 \times CF \times V_{TARGET}$.

Subsequently, the read/write circuit 2 may charge the electric charge in the first global bit line GBL0. That is, the charge amount charged in the first capacitor C0, Q0 may be $1 \times CF \times V_{TARGET}$. However, since $1/2 \times CF \times V_{TARGET}$ has already been charged in the first capacitor C0 through the electric charge sharing, only current enough to charge residual $1/2 \times CF \times V_{TARGET}$ may be supplied to the read/write circuit 2.

Subsequently, the precharge circuit 11 may charge the dummy capacitor DC of the dummy global bit line DGBL again. Since $1/2 \times CF \times V_{TARGET}$ has already been charged in the dummy capacitor DC, only current enough to charge residual $1/2 \times CF \times V_{TARGET}$ may be supplied to the precharge circuit 11.

Subsequently, the dummy capacitor DC and the second capacitor C1 may share the electric charge. As a result of sharing the electric charge, the charge amount charged in the second capacitor C1, Q1 may be $1/2 \times CF \times V_{TARGET}$.

Subsequently, the read/write circuit 2 may charge the electric charge in the second global bit line GBL1. Similarly, only current enough to charge $1/2 \times CF \times V_{TARGET}$ may be supplied to the read/write circuit 2.

In summary, the dummy global bit line DGBL may be precharged with the target voltage. Before reading or writing a normal memory cell, the dummy global bit line DGBL precharged with the target voltage and a normal global bit line GBL0 or GBL1 may be electrically connected with each other to share electric charge.

Figure 9:
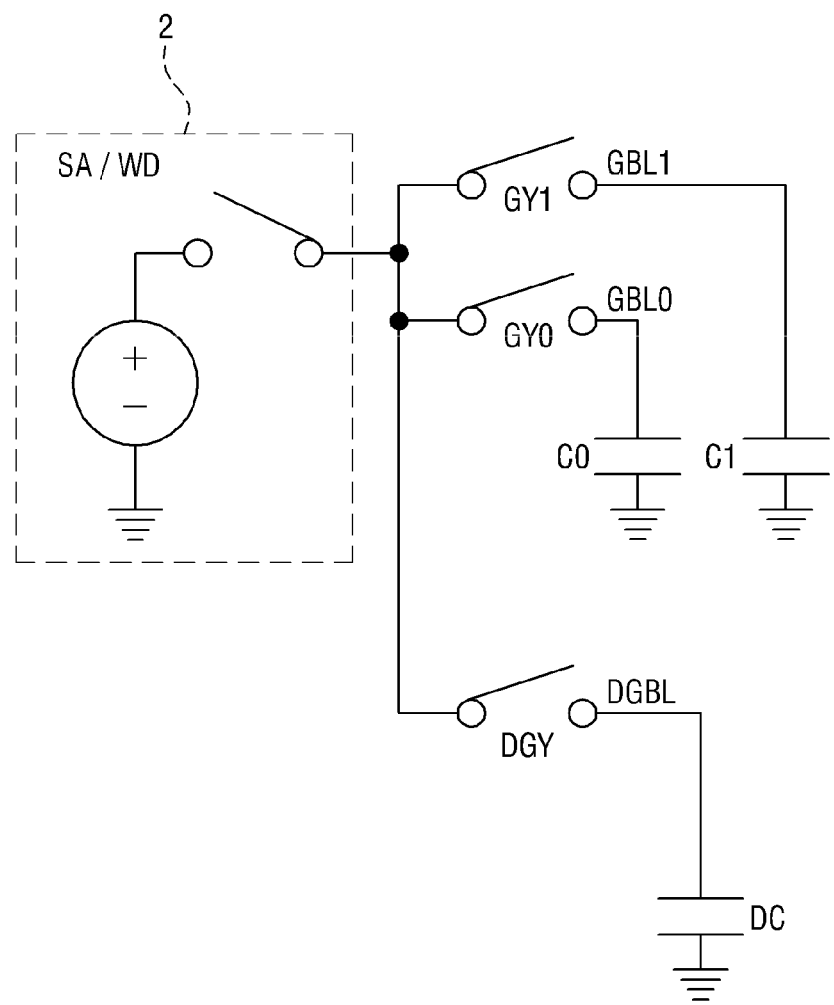
FIG. 9 is a diagram illustrating a non-volatile memory device according to a third embodiment of the inventive concept.

FIG. 9 is a diagram describing a non-volatile memory device according to a third embodiment of the inventive concept. For convenience of the description, differences from the description with reference to FIG. 8 will be primarily described.

Referring to FIG. 9, the non-volatile memory device according to the third embodiment of the inventive concept may not include a separate precharge circuit (see reference numeral 11 of FIG. 8). The read/write circuit 2 may perform an operation of the precharge circuit 11 described in FIG. 8. The read/write circuit 2 may serve to charge the dummy capacitor DC.

Figure 10:
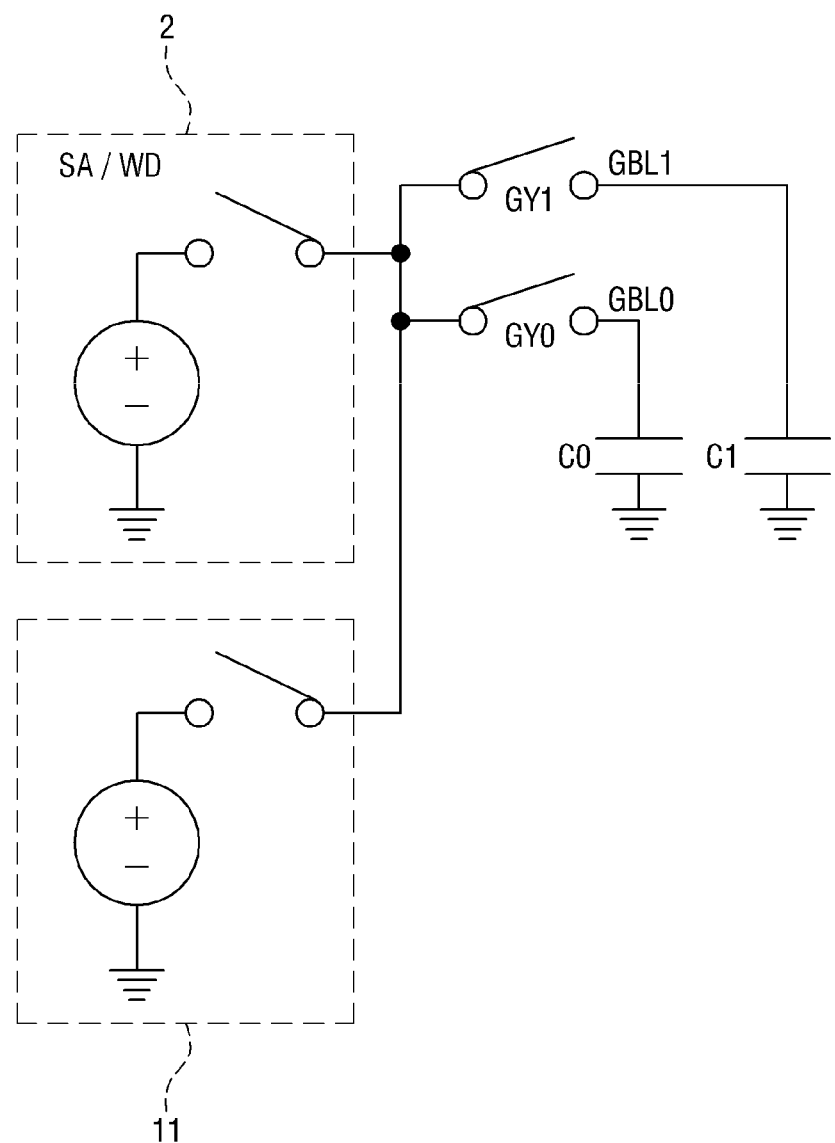
FIG. 10 is a diagram illustrating a non-volatile memory device according to a fourth embodiment of the inventive concept.

FIG. 10 is a diagram describing a non-volatile memory device according to a fourth embodiment of the inventive concept. For convenience of the description, differences from the description with reference to FIG. 8 will be primarily described.

Referring to FIG. 10, the non-volatile memory device according to the fourth embodiment of the inventive concept may not include a separate dummy global bit line DGBL, a separate dummy local bit line, and the like. That is, any one of a plurality of normal global bit lines may be selected to continuously use the selected normal global bit line for sharing the electric charge. In FIG. 10, for example, the first global bit line GBL0 may be used for sharing the electric charge. For example, when the first global bit line GBL0 is charged with $1 \times CF \times V_{TARGET}$, and the read/write operation needs to be performed for other global bit lines GBL1 to GBLn, the first global bit line GBL0 and the other global bit lines GBL1 to GBLn may share the electric charge.

Figure 11:
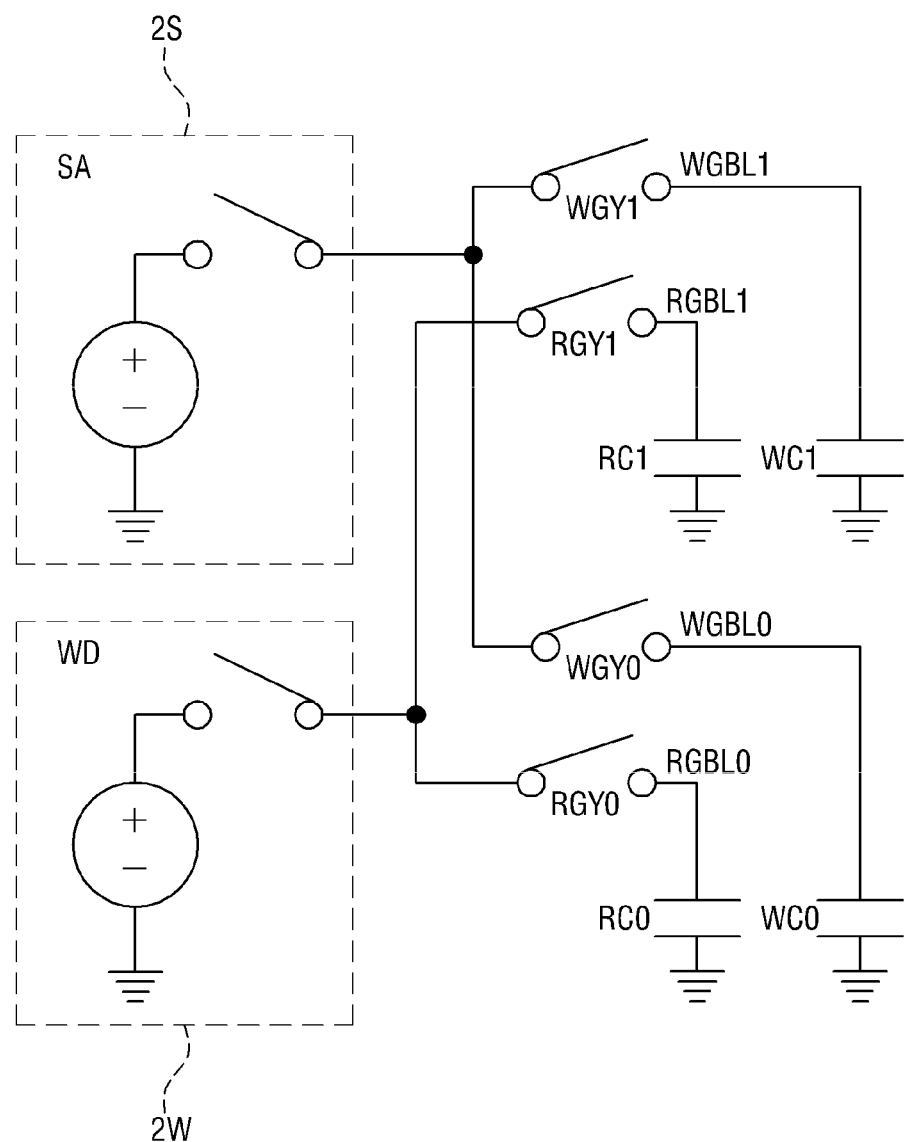
FIG. 11 is a diagram illustrating a non-volatile memory device according to a fifth embodiment of the inventive concept.

FIG. 11 is a diagram describing a non-volatile memory device according to a fifth embodiment of the inventive concept. Differences from the description with reference to FIGS. 5 to 7 will be primarily described.

Referring to FIG. 11, in the non-volatile memory device according to the fifth embodiment of the inventive concept, the first global bit line GBL0 may include a first write global bit line WGBL0 and a first read global bit line RGBL0, and the second global bit line GBL1 may include a second write global bit line WGBL1 and a second read global bit line RGBL1. That is, the global bit line used in the write operation and the global bit line used in the read operation may be separately provided. In such a case, for example, a read while write (RWW) operation may be performed to enhance an operating speed.

The first write global bit line WGBL0 and the second write global bit line WGBL1 may share the electric charge as described above. The first read global bit line RGBL0 and the second read global bit line RGBL1 may share the electric charge as described above. For example, the first write global bit line WGBL0 and the second read global bit line RGBL1 may not share the electric charge.

A level of current (that is, write current) used in the write operation and a level of current (that is, read current) used in the read operation may be different from each other. For example, the level of the write current may be higher than that of the read current. The reason is that the write current should change a state of a variable resistance element (phase change material) and the read current should be within the range in which the state of the variable resistance element is not changed. Therefore, a charge amount charged in the first write global bit line WGBL0 and a charge amount charged in the first read global bit line RGBL0 may be different from each other. For example, the first write global bit line WGBL0 may be charged with $1/2 \times CF \times V_{TARGET1}$ and the first read global bit line RGBL0 may be charged with $1/2 \times CF \times V_{TARGET2}$.

Meanwhile, in the write operation, the electric charge may be shared regardless of written data.

Alternatively, the electric charge may be selectively shared according to the written data. For example, in case of reset data, the electric charge may be shared and in case of set data, the electric charge may not be shared. Alternatively, even in case of the set data, the electric charge may be selectively shared according to a waveform of used set current.

Although not illustrated in FIG. 11, separately providing the global bit line used in the write operation and the global bit line used in the read operation may be applied to even FIGS. 8 to 10.

Figure 12:
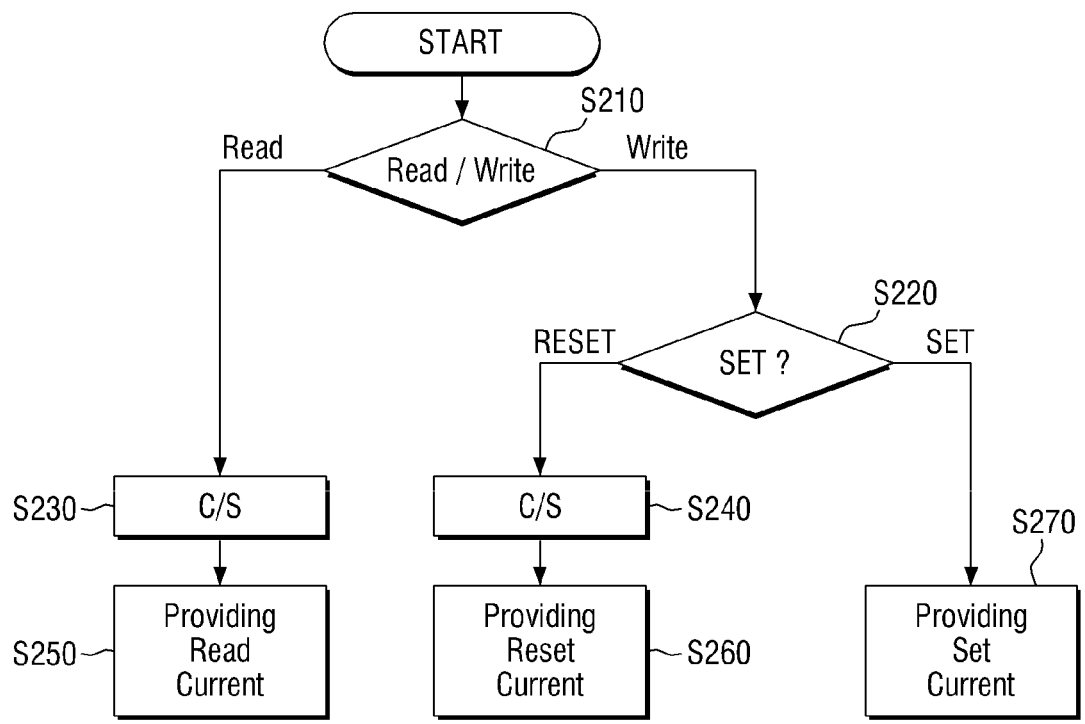
FIG. 12 is a diagram illustrating an operation of a non-volatile memory device according to a sixth embodiment of the inventive concept.
Figure 13:
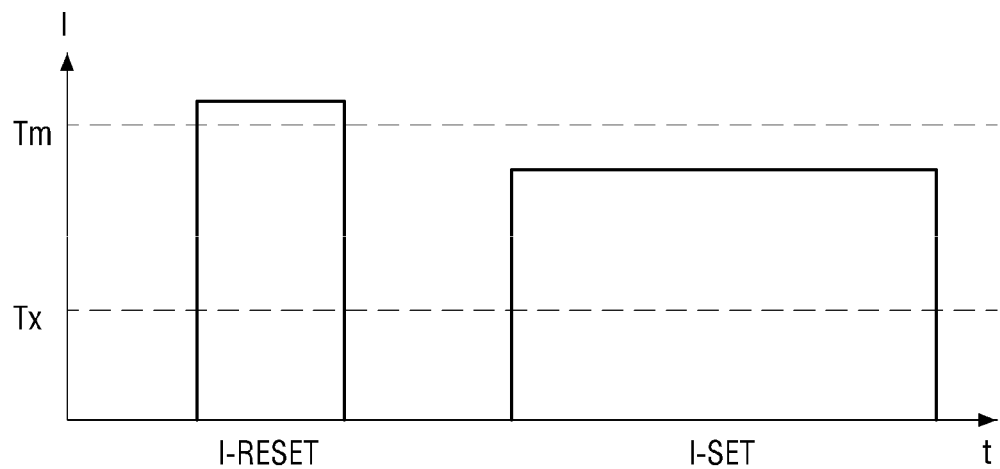
FIGS. 13 and 14 are diagrams illustrating an exemplary set current and reset current.
Figure 14:
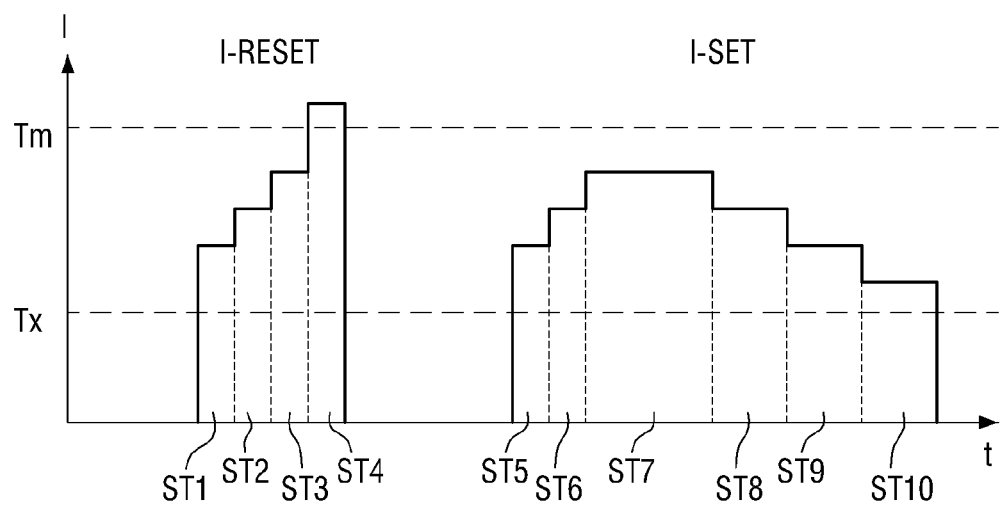

FIG. 12 is a diagram describing an operation of a non-volatile memory device according to a sixth embodiment of the inventive concept. FIGS. 13 and 14 are diagrams describing exemplary set current and reset current.

Referring to FIG. 12, first, a read operation or a write operation may be determined (S210).

In case of the read operation, a global bit line (for example, GBL1) to be read and another precharged global bit line (for example, GBL0 or DGBL) may share electric charge (S230). The global bit line GBL1 may be charged with $1/2 \times CF \times V_{TARGET1}$. Subsequently, read current may be provided to the global bit line GBL1 so that the global bit line GBL1 can be charged with $1 \times CF \times V_{TARGET1}$ (S250).

Meanwhile, in case of the write operation, whether the written data is set or reset may be checked (S220).

When the written data is reset, the global bit line (for example, GBL1) to be written and another precharged global bit line (GBL0 or DGBL) may share the electric charge (S240). The global bit line GBL1 may be charged with $1/2 \times CF \times V_{TARGET2}$. Subsequently, reset current may be provided to the global bit line GBL1 so that the global bit line GBL1 can be charged with $1 \times CF \times V_{TARGET2}$ (S260).

On the contrary, when the written data is set, set current may be provided to the global bit line (for example, GBL1) to be written without sharing the electric charge (S270).

In summary, when first data (for example, reset data) is written in a memory cell, the electric charge may be shared before providing first write current to the memory cell. When second data (for example, set data) other than the first data is written in the memory cell, the electric charge may not be shared before providing second write current to the memory cell.

Herein, referring to FIGS. 13 and 14, forms of the reset current and the set current may be diversified.

As illustrated in FIG. 13, reset current I_RESET may heat a phase change material at a melting point Tm or higher for a relatively short time. On the contrary, set current I_SET may heat the phase change material in a set window between the melting point Tm and a crystallization temperature Tx for a relatively long time.

As illustrated in FIG. 14, the reset current I_RESET may include several stages ST1 to ST4 having a current amount which sequentially increases.

The set current I_SET may include several stages ST5 to ST7 having a current amount which sequentially increases and several stages ST8 to ST10 having a current amount which sequentially decreases. As described above, in case of sequentially decreasing the current amount of the set current I_SET (that is, gradually quenched), states of a plurality of memory cells having various reference distributions for being converted into a set state may be more stably converted into the set state. The quenching may be ended above the crystallization temperature Tx, and may be progressed up to the vicinity of 0° C., as illustrated in FIG. 14.

Meanwhile, even in case of the set data, the electric charge may be selectively shared according to a waveform of used set current I_SET. For example, when the set current I_SET illustrated in FIG. 13 is used, the electric charge may be shared. On the contrary, when the set current I_SET (that is, set current having a quenching interval) illustrated in FIG. 14 is used, the electric charge may not be shared.

Figure 15:
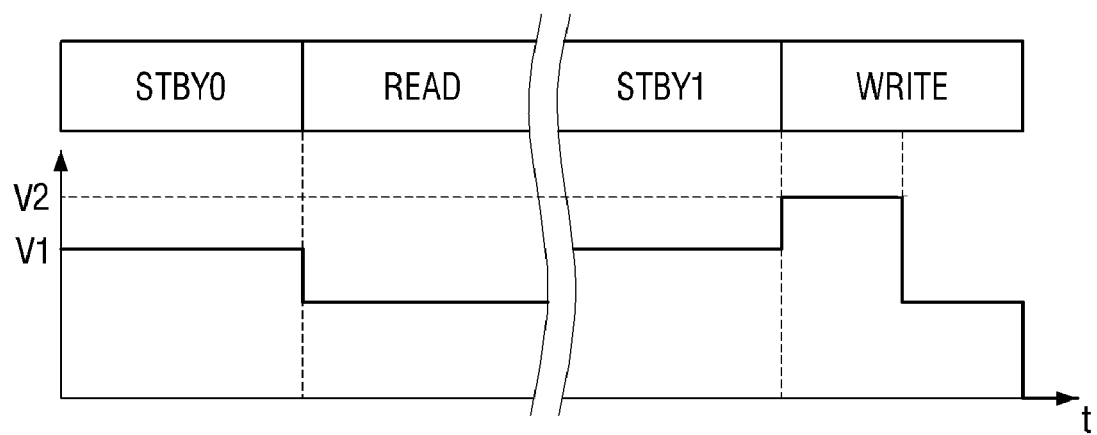
FIG. 15 is a diagram illustrating an operation of a non-volatile memory device according to a seventh embodiment of the inventive concept.

FIG. 15 is a diagram describing an operation of a non-volatile memory device according to a seventh embodiment of the inventive concept. FIG. 15 illustrates a voltage level of the dummy global bit line DGBL of FIG. 8.

Referring to FIGS. 8 and 15, in a standby interval STBY0, the dummy global bit line DGBL may previously charge electric charge as large as a first charge amount associated with the read operation. For example, the dummy global bit line DGBL may be charged with voltage as large as V1. V1 may be voltage corresponding to the read current used in the read operation. In a read interval READ, a precharged dummy global bit line DGBL1 and the normal global bit line (for example, GBL1) may share electric charge. Therefore, a voltage level of the dummy global bit line DGBL may be decreased.

Since the read operation is performed significantly rapidly, when the dummy global bit line DGBL is maintained to the V1 in the standby interval STBY0 in advance, the read operation may be smoothly performed.

On the contrary, in the standby interval STBY1, the dummy global bit line DGBL may charge in advance electric charge as large as the first charge amount associated with the read operation. When the write operation is started, the dummy global bit line DGBL may charge electric charge that are as large as a third charge amount associated with the write operation and are larger than the first charge amount. For example, the dummy global bit line DGBL may be charged with voltage as large as V2. Thereafter, the dummy global bit line DGBL and the normal global bit line (for example, GBL1) may share electric charge. Therefore, the voltage level of the dummy global bit line DGBL may be decreased.

Since the write operation is relatively slowly performed, the dummy global bit line DGBL may not be charged with a high level like the V2 in the standby interval STBY1 in advance. After the write operation is started, the dummy global bit line DGBL may be used with being increased to the V2.

In FIG. 15, in the standby intervals STBY0 and STBY1, the dummy global bit line DGBL may be charged with the V1 level as an example, but the inventive concept is not limited thereto. That is, when the dummy global bit line DGBL is not used (in FIGS. 5 to 7, FIG. 10, and the like), a predetermined normal global bit line may be charged with the V1 level in advance in the standby intervals STBY0 and STBY1.

FIGS. 16 to 20 are diagrams describing memory systems according to embodiments of the inventive concept. Herein, FIGS. 16 to 20 relate to memory systems using the non-volatile memory device according to embodiments of the inventive concept.

Figure 16:
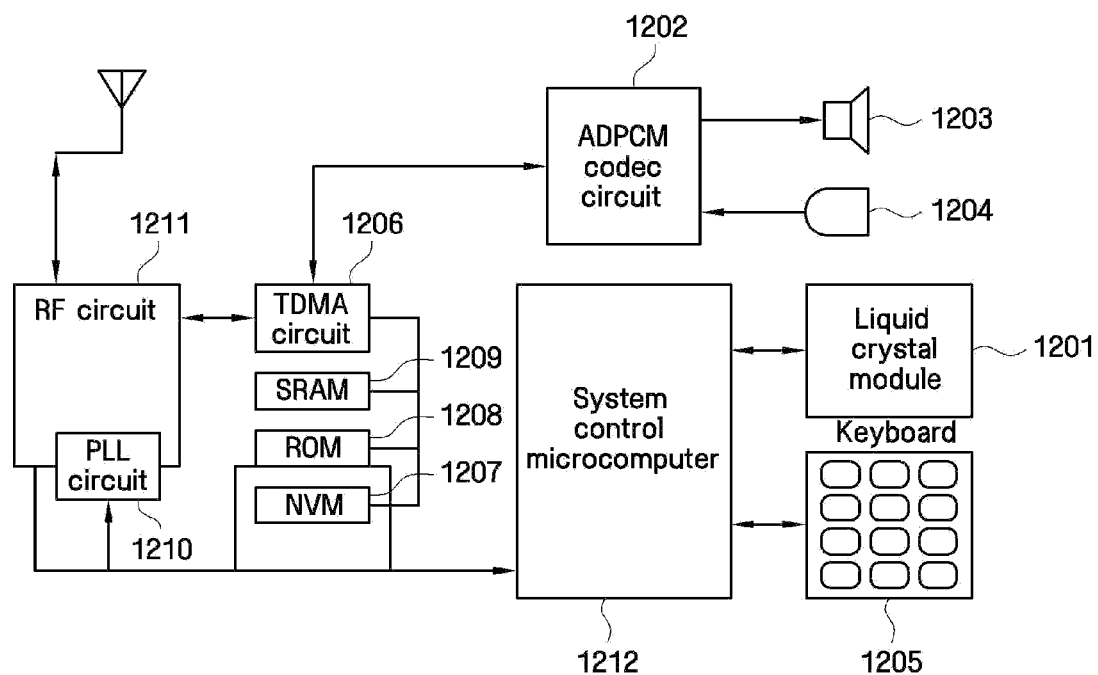
FIGS. 16, 17, 18, 19 and 20 are diagrams illustrating memory systems according to embodiments of the inventive concept.

FIG. 16 is an exemplary diagram of a cellular phone system used by the non-volatile memory device according to embodiments of the inventive concept.

Referring to FIG. 16, the cellular phone system may include a liquid crystal module 1201, a compression or decompression ADPCM codec circuit 1202 for compressing sound or decompressing the compressed sound, a speaker 1203, a microphone 1204, a keyboard 1205, a TDMA circuit 1206 for time-division multiplexing digital data, a PLL circuit 1210 for setting a carrier frequency of a radio signal, an RF circuit 1211 for transferring or receiving the radio signal, and the like.

Further, the cellular phone system may include various types of memory devices, and may also include, for example, a non-volatile memory device 1207, a ROM 1208, and an SRAM 1209. As the non-volatile memory device 1207, the non-volatile memory device according to embodiments of the inventive concept may be used and may store, for example, an ID number. The ROM 1208 may store a program. The SRAM 1209 may serve as a task area for a system control microcomputer 1212, or may temporarily store data. Herein, the system control microcomputer 1212 as a processor may control a write operation and a read operation of the non-volatile memory device 1207.

Figure 17:
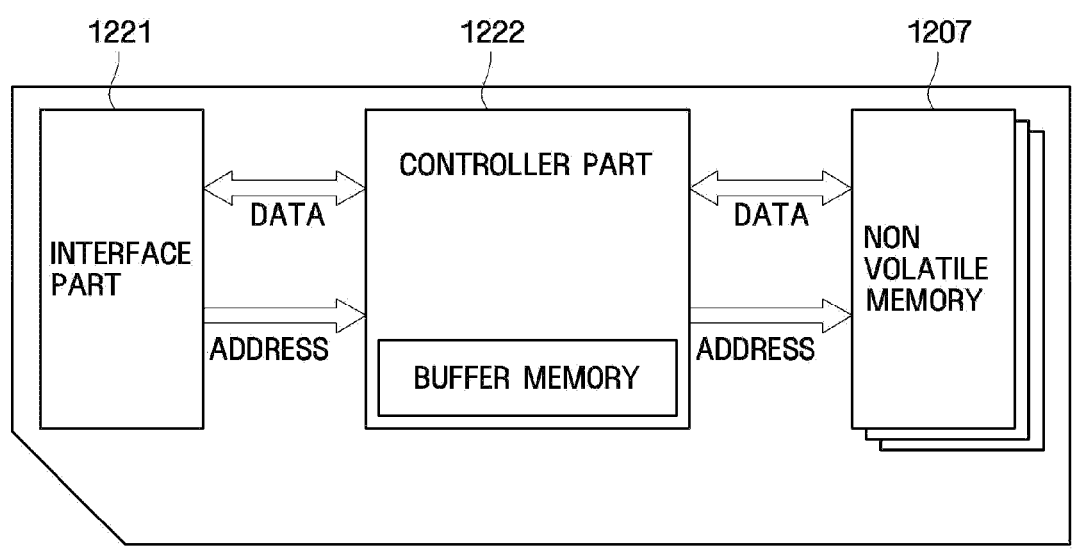

FIG. 17 is an exemplary diagram of a memory card in which the non-volatile memory device according to embodiments of the inventive concept is used. The memory card may be, for example, an MMC card, an SD card, a multi-use card, a micro SD card, a memory stick, a compact SD card, an ID card, a PCMCIA card, an SSD card, a chip card, a smart card, a USB card, and the like.

Referring to FIG. 17, the memory card may include at least one of an interface part 1221 that interfaces with the outside devices, a controller part 1222 that has a buffer memory and controls an operation of the memory card, and a non-volatile memory device 1207 according to embodiments of the inventive concept. The controller part 1222 as the processor may control a write operation and a read operation of the non-volatile memory device 1207. In detail, the controller part 1222 may be coupled with the non-volatile memory device 1207 and the interface part 1221 through a data bus DATA and an address bus ADDRESS.

Figure 18:
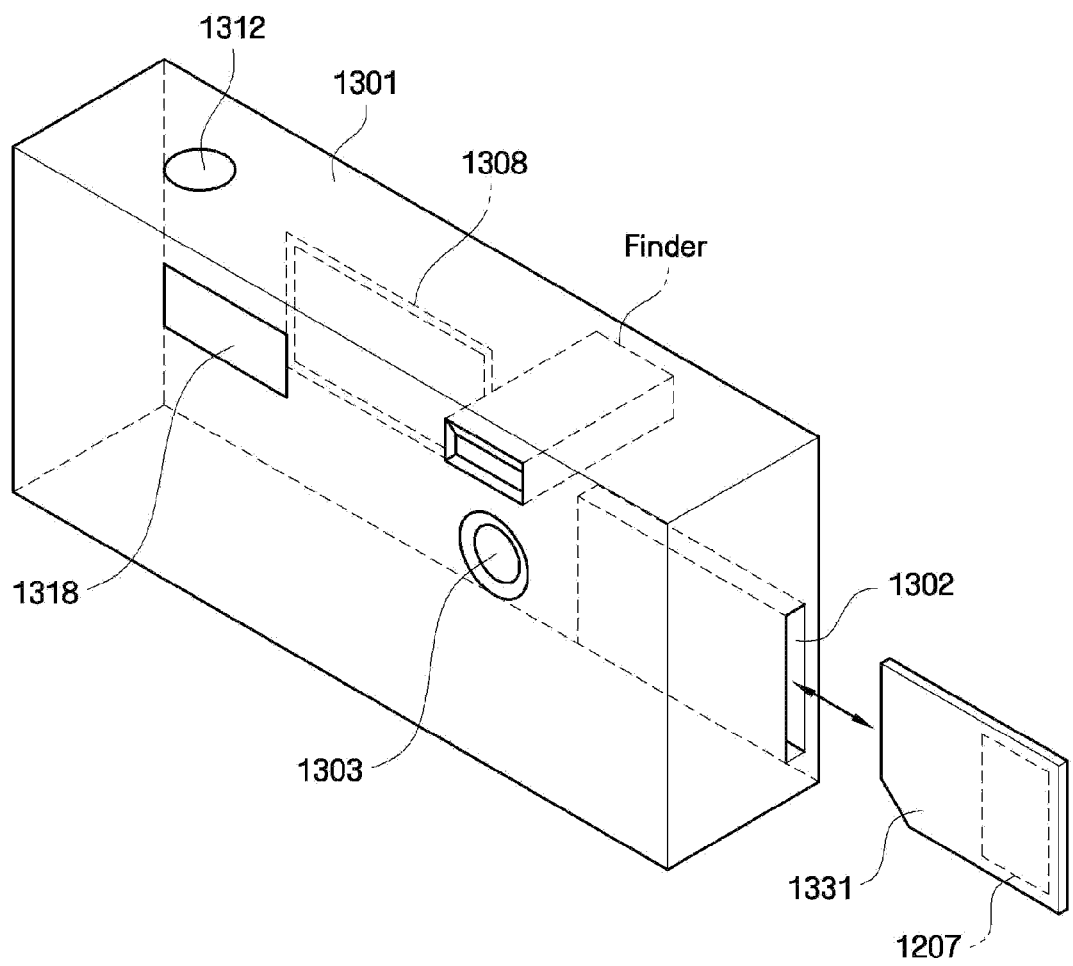

FIG. 18 is an exemplary diagram of a digital still camera in which the non-volatile memory device according to embodiments of the inventive concept is used.

Referring to FIG. 18, the digital still camera may include a body 1301, a slot 1302, a lens 1303, a display unit 1308, a shutter button 1312, a strobe 1318, and the like. In particular, the memory card 1331 may be inserted into the slot 1302 and the memory card 1331 may include at least one of the non-volatile memory devices 1207 according to embodiments of the inventive concept.

In case that the memory card 1331 is a contact type, when the memory card 1331 is inserted into the slot 1302, the memory card 1331 and a specific electric circuit on a circuit board may electrically contact each other. In case that the memory card 1331 is a non-contact type, the memory card 1331 may communicate with the digital still camera through a radio signal.

Figure 19:
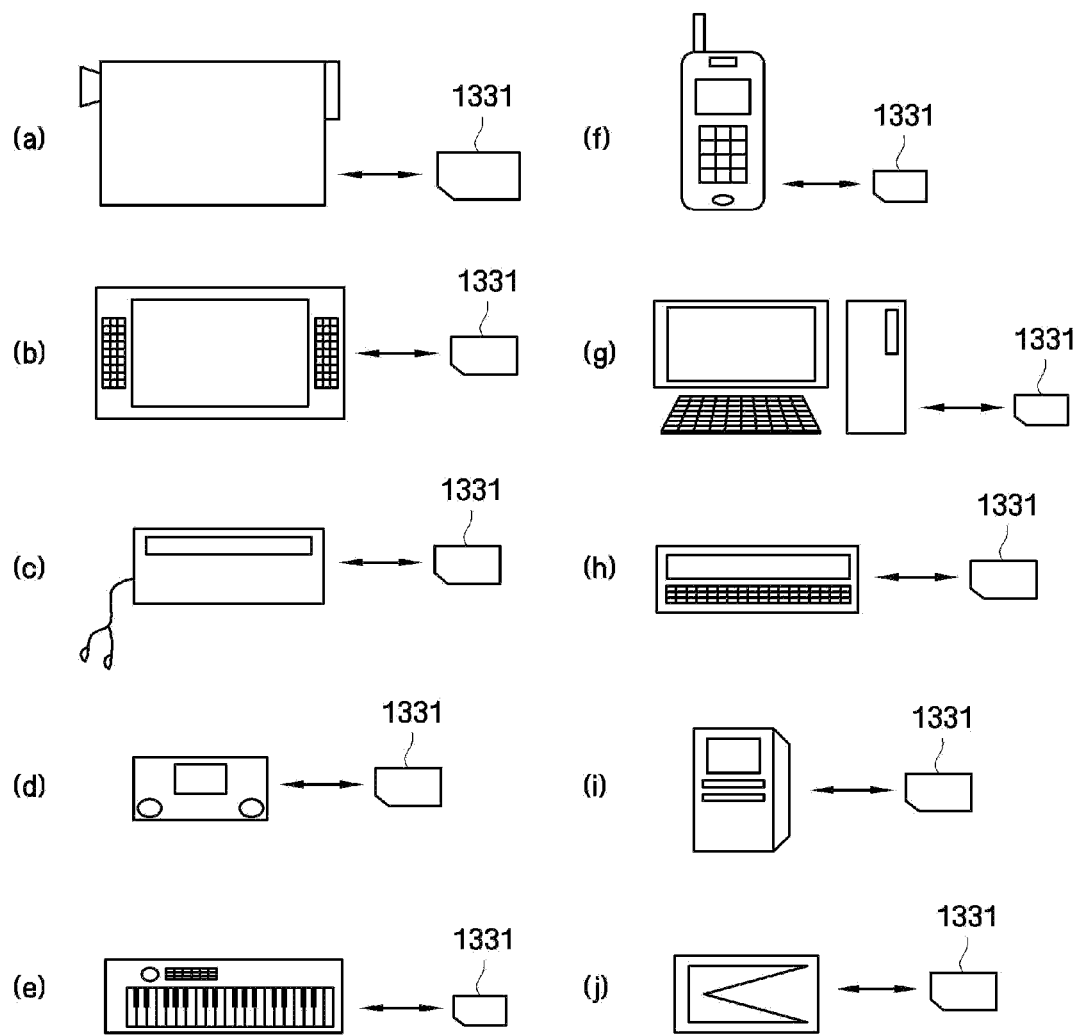

FIG. 19 is an exemplary diagram describing various systems in which the memory card of FIG. 17 is used.

Referring to FIG. 19, the memory card 1331 may be used in (a) a video camera, (b) a television, (c) an audio device, (d) a game device, (e) an electronic music device, (f) a cellular phone, (g) a computer, (h) a personal digital assistant (PDA), (i) a voice recorder, (j) a PC card, and the like.

Figure 20:
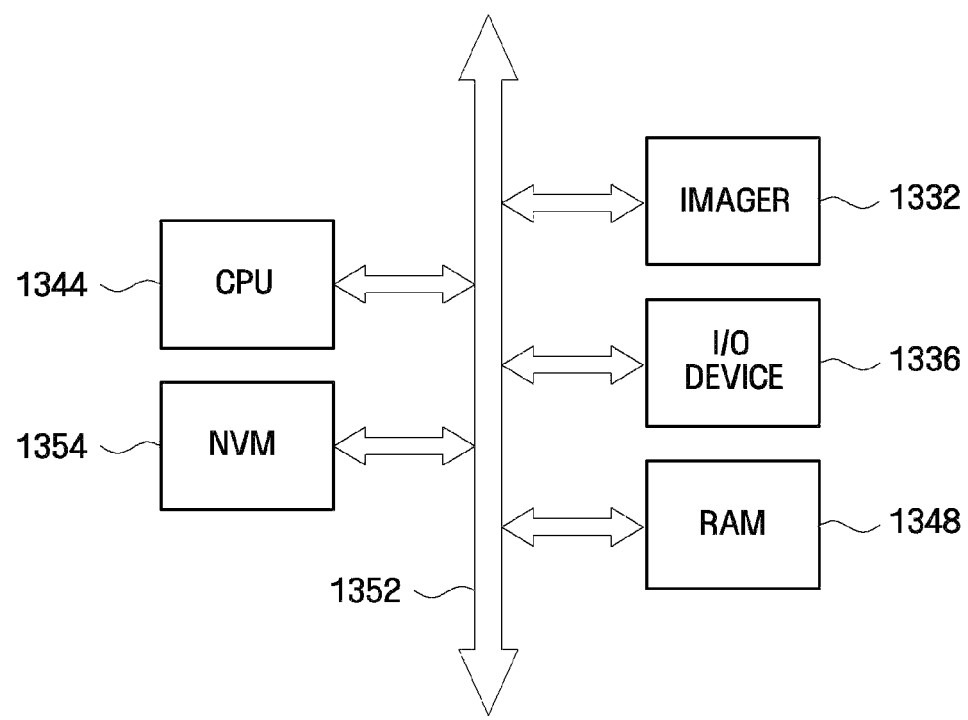

FIG. 20 is an exemplary diagram of an image sensor system in which the non-volatile memory device according to embodiments of the inventive concept is used.

Referring to FIG. 20, the image sensor system may include an image sensor 1332, an input/output device 1336, a RAM 1348, a CPU 1344, a non-volatile memory device 1354 according to embodiments of the inventive concept, and the like. Respective components, that is, the image sensor 1332, the input/output device 1336, the RAM 1348, the CPU 1344, and the non-volatile memory device 1354 may communicate with each other through a bus 1352. The image sensor 1332, may include photo sensing elements such as a photo gate, a photo diode, and the like. The respective components may be configured as one chip together with the processor, or may be configured by respective chips separated from the processor.

The foregoing is illustrative of the inventive concept and is not to be construed as limiting thereof. Although a few embodiments of the inventive concept have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. Therefore, it is to be understood that the foregoing is illustrative of the inventive concept and is not to be construed as limited to the specific embodiments disclosed, and that modifications to the disclosed embodiments, as well as other embodiments, are intended to be included within the scope of the appended claims. The inventive concept is defined by the following claims, with equivalents of the claims to be included therein.

What is claimed is:

1. A memory device comprising:
    a first local bit line electrically connected with a first memory cell;
    a first global bit line electrically connected with the first local bit line;
    a second local bit line electrically connected with a second memory cell; and
    a second global bit line electrically connected with the second local bit line,
    wherein the first global bit line is configured to be primarily charged with electric charge,
    the first global bit line and the second global bit line are configured to share the primarily charged electric charge, and
    the second global bit line is secondarily charged with the electric charge.

2. The memory device of claim 1, wherein:
    a charge amount charged in the first global bit line through primary charging and a charge amount charged in the second global bit line through secondary charging are the same as each other, and
    an amount of secondary current used for the secondary charging is smaller than an amount of primary current used for the primary charging.

3. The memory device of claim 1, wherein primary charging of the first global bit line is a read operation of the first memory cell, and
    secondary charging of the second global bit line is a read operation of the second memory cell.

4. The memory device of claim 1, wherein primary charging of the first global bit line is a write operation of the first memory cell, and
    secondary charging of the second global bit line is a write operation of the second memory cell.

5. The memory device of claim 4, wherein each of the first memory cell and the second memory cell is a memory cell including a resistor.

6. The memory device of claim 5, wherein the write operation of the first memory cell is performed to write reset data in the first memory cell.

7. The memory device of claim 1, wherein primary charging of the first global bit line and secondary charging of the second global bit line are performed by a read circuit or by a write circuit.

8. The memory device of claim 1, wherein secondary charging of the second global bit line is performed by a read circuit or by a write circuit, and
    primary charging of the first global bit line is performed by a precharge circuit other than the read circuit and the write circuit.

9. The memory device of claim 1, wherein the first local bit line is a dummy local bit line, and
    the first global bit line is a dummy global bit line.

10. The memory device of claim 9, further comprising:
    a third local bit line electrically connected with a third memory cell; and
    a third global bit line electrically connected with the third local bit line,
    wherein the third global bit line and the first global bit line are configured to share electric charge, before tertiarily charging the third global bit line.

11. The memory device of claim 9, wherein the first global bit line is configured to be charged with electric charge as large as a first charge amount associated with a read operation in a standby interval, and
    when a write operation is started, the first global bit line is configured to be charged with electric charge as large as a second charge amount associated with the write operation and larger than the first charge amount.

12. The memory device of claim 1, wherein the first global bit line includes a first write global bit line and a first read global bit line,
    the second global bit line includes a second write global bit line and a second read global bit line, and
    electric charge sharing includes first electric charge sharing by the first write global bit line and the second write global bit line, or second electric charge sharing by the first read global bit line and the second read global bit line.

13. The memory device of claim 12, wherein in primary charging of the first global bit line, a charge amount charged in the first write global bit line and a charge amount charged in the first read global bit line are different from each other.

14. A memory device comprising:
    a normal local bit line electrically connected with a normal memory cell;
    a normal global bit line electrically connected with the normal local bit line;
    a dummy local bit line electrically connected with a dummy memory cell;
    a dummy global bit line electrically connected with the dummy local bit line and precharged with a target voltage;
    a read/write circuit configured to read data by providing read current to the normal memory cell and/or to write data by providing write current to the normal memory cell; and
    a precharge circuit configured to precharge the dummy global bit line,
    wherein the precharged dummy global bit line and the normal global bit line are electrically connected with each other, before reading or writing the normal memory cell.

15. The memory device of claim 14, further comprising:
    a first global pass circuit disposed between the normal global bit line and the read/write circuit; and
    a second global pass circuit disposed between the dummy global bit line and the read/write circuit.

16. A memory card comprising:
    a non-volatile memory device; and
    a controller configured to control the non-volatile memory device,
    wherein the non-volatile memory device includes:
    a first local bit line electrically connected with a first memory cell;
    a first global bit line electrically connected with the first local bit line;
    a second local bit line electrically connected with a second memory cell;
    a second global bit line electrically connected with the second local bit line; and
    a read/write circuit configured to charge the first memory cell and/or the second memory cell, and
    wherein when first data is written in the second memory cell, the first global bit line and the second global bit line share electric charge before providing first write current to the second memory cell, and when second data other than the first data is written in the second memory cell, the first global bit line and the second global bit line do not share electric charge before providing second write current to the second memory cell.

17. The memory card of claim 16, wherein the first data is reset data and the second data is set data.

18. The memory card of claim 16, wherein the second write current includes a quenching interval.

19. The memory card of claim 16, wherein when data is read from the second memory cell, the first global bit line and the second global bit line share electric charge before providing read current to the second memory cell.

20. The memory card of claim 16, wherein each of the first memory cell and the second memory cell is a non-volatile memory cell including a resistor.

* * * * *